United States Patent
Norimatsu et al.

(10) Patent No.: US 9,750,125 B2
(45) Date of Patent: Aug. 29, 2017

(54) POWER SUPPLY APPARATUS

(71) Applicant: Hitachi, Ltd., Chiyoda-ku, Tokyo (JP)

(72) Inventors: Yasuaki Norimatsu, Tokyo (JP); Akihiko Kanouda, Tokyo (JP); Yuuichi Mabuchi, Tokyo (JP); Takuya Ishigaki, Tokyo (JP); Takae Shimada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/159,337

(22) Filed: May 19, 2016

(65) Prior Publication Data

US 2016/0352230 A1 Dec. 1, 2016

(30) Foreign Application Priority Data

May 26, 2015 (JP) .................................. 2015-105982

(51) Int. Cl.
*H05K 7/20* (2006.01)
*H05K 1/02* (2006.01)
(Continued)

(52) U.S. Cl.
CPC ......... *H05K 1/0201* (2013.01); *H05K 1/0207* (2013.01); *H05K 7/20909* (2013.01);
(Continued)

(58) Field of Classification Search
CPC ............... H01F 2027/406; H01F 27/08; H01F 27/2876; H01L 23/34; H02M 7/003;
(Continued)

(56) References Cited

U.S. PATENT DOCUMENTS 8,363,412 B2 * 1/2013 Budai ..................... G06F 1/185
165/104.33
2006/0274561 A1 * 12/2006 Ahmed ................. H02M 7/003
363/132
(Continued)

FOREIGN PATENT DOCUMENTS

CN 101106335 A 1/2008
EP 1 657 809 A1 5/2006
(Continued)

OTHER PUBLICATIONS

M. Schweizer et al., "Comparison of the chip area usage of 2-level and 3-level voltage source converter topologies," Nov. 7, 2010, pp. 391-396, Piscataway, NJ, XP031840109.
(Continued)

*Primary Examiner* — Nguyen Tran
(74) *Attorney, Agent, or Firm* — Crowell & Moring LLP

(57) ABSTRACT

Size and weight reduction of a transformer for system interconnection is needed. Applying an SST to the transformer can reduce the size and weight. However, it is also necessary to flexibly handle a wide range of voltages to match a high-voltage system or motor, reduce switching loss of a power device used in a power circuit such as a DC/DC converter and an inverter in association with frequency increase caused by application of the SST, and achieve size reduction of a cooling structure. Further, it is necessary to boost a voltage to a system voltage and reduce the size and weight of a large current path before the voltage boosting. Thus, an LLC resonant converter structure is applied, and a multiple-connection structure is employed in each of which a converter is arranged for an input or an inverter is arranged for an output. This enables handling of various voltage ranges by various combinations of the numbers of multiple connections of the inputs and the outputs. An insulation cooling structure is provided by a wind-tunnel structure in (Continued)

which two input and output substrates are opposed and are connected by insulation members, and another wind-tunnel structure arranged in the downstream of the wind-tunnel structure and including the LLC resonant structure therein. The wind-tunnel structures are integrated with each other.

12 Claims, 10 Drawing Sheets

(51) Int. Cl.
  *H02M 3/335*   (2006.01)
  *H02M 7/49*   (2007.01)
  *H02M 7/48*   (2007.01)
  *H02M 7/487*   (2007.01)

(52) U.S. Cl.
  CPC ............ *H02M 3/335* (2013.01); *H02M 7/487* (2013.01); *H02M 7/4807* (2013.01); *H02M 7/49* (2013.01); *Y02B 70/1433* (2013.01)

(58) Field of Classification Search
  CPC .. H05K 7/20927; H05K 7/2089; H05K 7/209; H02B 1/56; H01G 2/08; H01H 1/62; H01H 9/52; H02G 3/03; H02G 5/10; H02S 40/345; H02S 40/42
  USPC ................. 363/141, 144–147; 361/676–678, 361/679.46–679.54, 688–723
  See application file for complete search history.

(56) References Cited

U.S. PATENT DOCUMENTS

| | | |
|---|---|---|
| 2009/0303753 A1 | 12/2009 | Fu et al. |
| 2012/0091817 A1 | 4/2012 | Seymour et al. |
| 2012/0250255 A1 | 10/2012 | Shigeno et al. |
| 2014/0307482 A1 | 10/2014 | Chen et al. |
| 2015/0208556 A1* | 7/2015 | Kodama ................. B60L 3/003 363/123 |

FOREIGN PATENT DOCUMENTS

| | | |
|---|---|---|
| EP | 1 767 307 A1 | 3/2007 |
| EP | 2 730 453 A2 | 5/2014 |
| WO | WO 2009/157080 A1 | 12/2009 |

OTHER PUBLICATIONS

Extended European Search Report issued in counterpart European Application No. 16171426.6 dated Oct. 27, 2016 (ten (10) pages).

\* cited by examiner

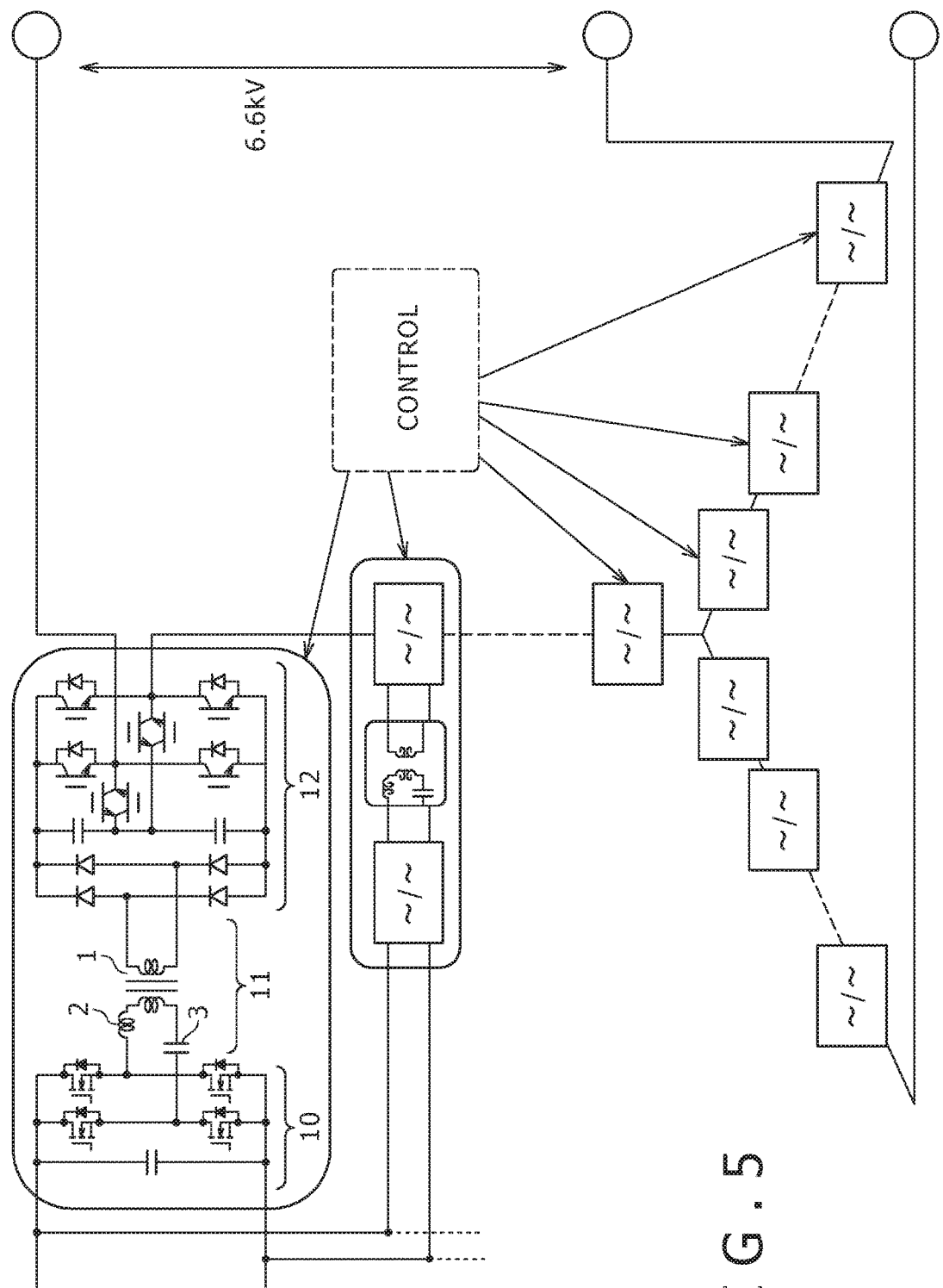
F I G . 5

POWER SUPPLY APPARATUS

BACKGROUND

The present invention relates to a power conversion device for a DC power and an AC power and a power-conversion control unit of the same.

Size and weight reduction of an isolation transformer for system interconnection has been difficult, because the transformer is driven at a low frequency of several tens of Hz that is the same as a system frequency. Applying an SST (Solid State Transformer) to a large, high voltage power use has been examined recently. The SST is configured by a combination of a high-frequency transformer and a power circuit, such as a DC/DC converter and an inverter, that drives the high-frequency transformer and inputs or outputs an AC current having the same frequency as that of the conventional one. The SST substitutes for the conventional transformer. The high-frequency transformer is driven at a high frequency of several tens to several hundreds of kHz, thereby the size and weight can be largely reduced even with the configuration of the SST in which the power circuit is added, as compared with the conventional transformer alone.

Introduction of natural energy, e.g., photovoltaics and wind-power generation, has been expanding globally and, as a use of a power converter for a system, a high-performance PCS (Power Conditioning System) has been demanded that can control an electric power of the nature energy and output the power to the system. A high-voltage isolation transformer is used for the output, which has to be driven at a low frequency of several tens of Hz that is the same as the system frequency. Therefore, equipment becomes larger.

Some power converters using a high-voltage power, which are for a high-voltage motor or pump and railway, for example, also use a high-voltage isolation transformer for an input. In the case of using the high-voltage isolation transformer for the input, as in the case of using it for the output, the high-voltage isolation transformer is driven at a low frequency of several tens of Hz that is the same as the system frequency by receiving an electric power from the system. Therefore, the equipment becomes larger.

SUMMARY

Applying the SST in order to achieve the size and weight reduction of the power converter for a high voltage use requires the size and weight reduction of a low-voltage large-current path at an input/output end of the inverter or the converter and a low-voltage side connection end of the transformer, small packaging that can be flexibly applied to various high voltages, and cooling of a power device used in the power converter, such as a DC/DC converter or the inverter, in association with the increase of the frequency for applying the SST, by a small cooler.

As for the low-voltage large-current path, a photovoltaic PCS with its output arranged on a high-voltage system side is described as an example. FIG. 2 illustrates a configuration of the photovoltaic PCS. An output voltage of a three-phase inverter, which is several hundreds of V, is boosted to 6.6 kV or higher by a step-up transformer through an LC output filter. In the case where the output voltage of the three-phase inverter is about 200 V, for example, output wiring capable of handling 2000 A or more is required for outputting 1 MW. Therefore, the wiring and a primary winding of the step-up transformer become large because they have to handle a large current. For achieving the size and weight reduction, it is effective to reduce the output current.

Regarding the packaging that can be applied to a high voltage, it is necessary to achieve the size reduction by a technique that enables the power converter to handle a wide range of a voltage by changing its input/output, or an optimal structure design that reduces a clearance and a creepage distance required for insulation.

Regarding the cooling of the power device, an IGBT is usually used as a power device of a conventional voltage converter for a high voltage use. The IGBT is an element suitable for a high withstand voltage in a range from several hundreds of V to several kV. However, it is realistic that the IGBT is switched at several kHz, and a method is therefore required that reduces switching loss in order to drive the IGBT at several tens of kHz. Also, it is necessary to examine a small-sized cooling structure considering insulation.

In view of the above problems, the present invention aims to provide a power conversion device that can be applied to a wide range of high input/output voltages by an application, can achieve reduction of switching loss associated with high-frequency driving caused by the use of an SST and size reduction of a cooling device, and can achieve size and weight reduction of a large current path.

According to one aspect of the present invention, a power supply apparatus is provided that includes a power supply module. The power supply module includes a wind tunnel structure having two power supply substrates with different voltage levels and insulation members forming two faces of the wind tunnel structure other than faces formed by the power supply substrates, each of the power supply substrates having a cooling unit mounted on only one of surfaces thereof, the power supply substrates being arranged with the cooling units opposed to each other. The power module also includes another wind tunnel arranged in a downstream of the wind structure. The two power-substrates are electrically connected to each other via a transformer and a capacitor arranged in the other wind tunnel.

According to the present invention, a method can be provided that can flexibly handle a variety of high input/output voltages. A small cooling structure is achieved that can reduce switching loss of a power device caused by increase of a switching frequency and can also consider insulation. Further, a current value on a low-voltage side of a conventional transformer can be largely reduced, so that size reduction of a current path can be achieved. Consequently, it is possible to replace the conventional transformer for system interconnection that is driven at the same low frequency as a system frequency with an SST, thereby size and weight reduction of a power converter for a high voltage use can be achieved.

BRIEF DESCRIPTION OF THE DRAWINGS

FIG. 5 is a circuit diagram illustrating an entire configuration in a case where a different circuit is applied as an inverter in the configuration of the first embodiment according to the present invention;

DETAILED DESCRIPTION

Figure 1:
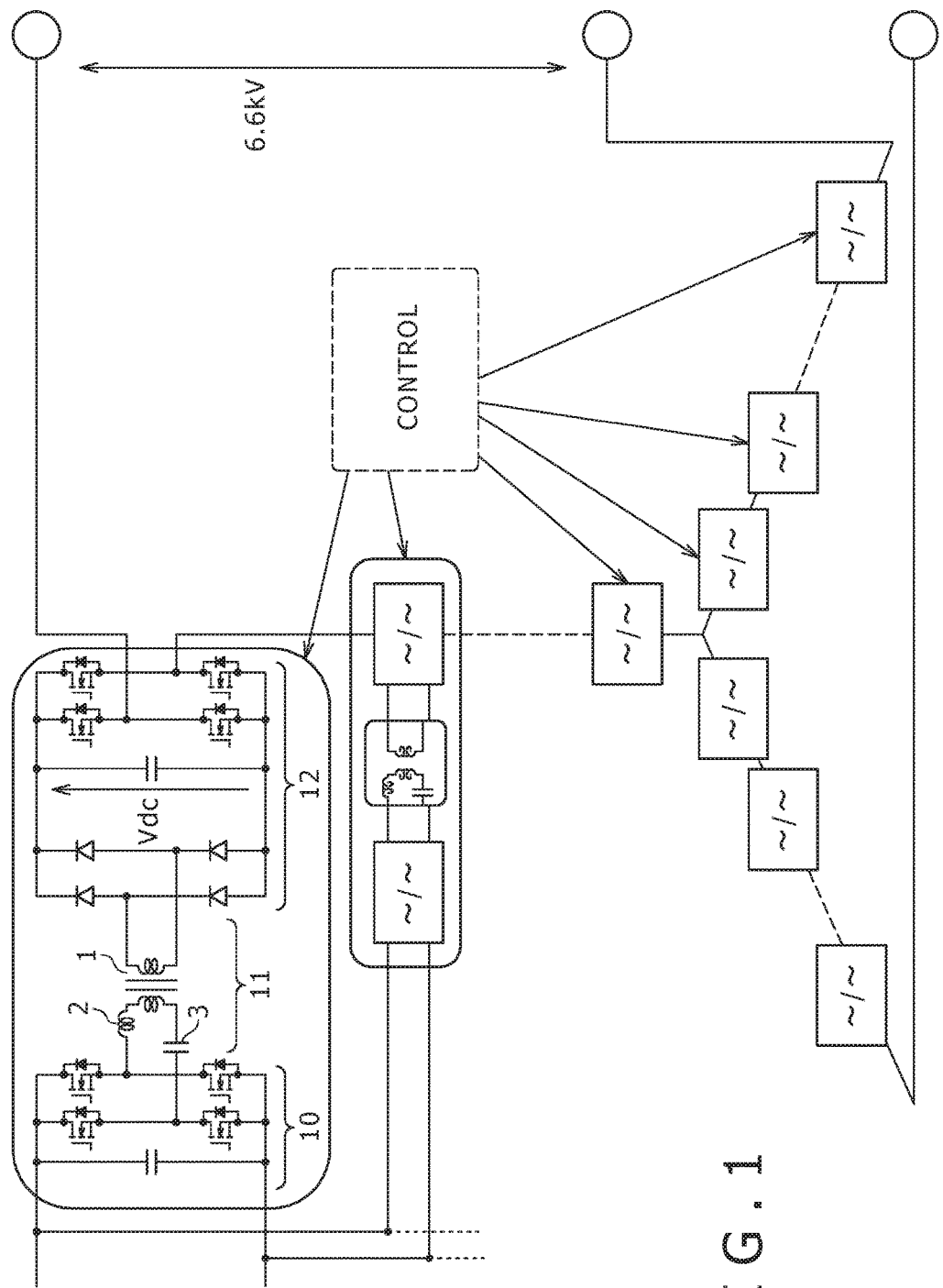
FIG. 1 is a circuit diagram illustrating a configuration of a first embodiment of the present invention.

Embodiments of a power conversion device and a control method thereof according to the present invention are described below, referring to the drawings.

First Embodiment

First, a configuration of the present embodiment is described below.

FIG. 1 illustrates the configuration of the present embodiment.

The configuration of the present embodiment is intended to be used for a PCS operating at several hundreds of kW to several MN that interconnects with a high voltage system (a 6.6 kV system).

A circuit configuration of an H-bridge LLC resonant converter 10 is used with a high-frequency transformer 1, and a DC output rectified in H-bridge diodes is output as an AC output by means of an inverter 12 to a system. By employing a serial multistage configuration in which the inverters 12 are connected in series, the illustrated configuration can handle a high-voltage output, a relatively low-voltage power semiconductor device, e.g., a 1700 V, 1200 V, and a 650 V power semiconductor device, can be used for the inverter 12, and Vdc becomes a voltage similar to that of the power semiconductor device. Therefore, a DC capacitor can also be formed by a capacitor of a lower voltage as compared with a system voltage.

The H-bridge LLC resonant converter 10 is operated at a DC voltage of 1000 V or less. Therefore, a MOS FET that is suitable for high-frequency driving is intended to be used. A switching frequency is intended to be set at several tens of kHz to several hundreds of kHz. As the MOS FET to be used, an SiC MOS FET having a high withstand voltage and being suitable for high-frequency switching can be applied, or another device can be applied as long as it has the same function. On the secondary side of the LLC resonant converter, it is intended that smoothening by diodes is performed. Other than Si diodes, Si Schottky barrier diodes or SiC Schottky barrier diodes can be applied in order to reduce conduction loss. Further, SiC MOS FETs can be used in synchronization with each other to reduce the loss. Other devices can also be used as long as they have the same function.

A leakage inductance Lr 2 and a resonant capacitor Cr 3 are connected to an excitation inductance Lm of the high-frequency transformer 1 so that the inductance Lr 2 and the capacitor Cr 3 resonant, for achieving the transformer 11 that is an LLC resonant type. The leakage inductance Lr 2 can be integrated within the high-frequency transformer as a structure enabling adjustment of a constant of a leakage magnetic flux in the high-frequency transformer. The resonant capacitor Cr 3 is intended to be formed by a film capacitor, but can be formed by another device as long as it has the same function. An insulation function will be described later.

Figure 3:
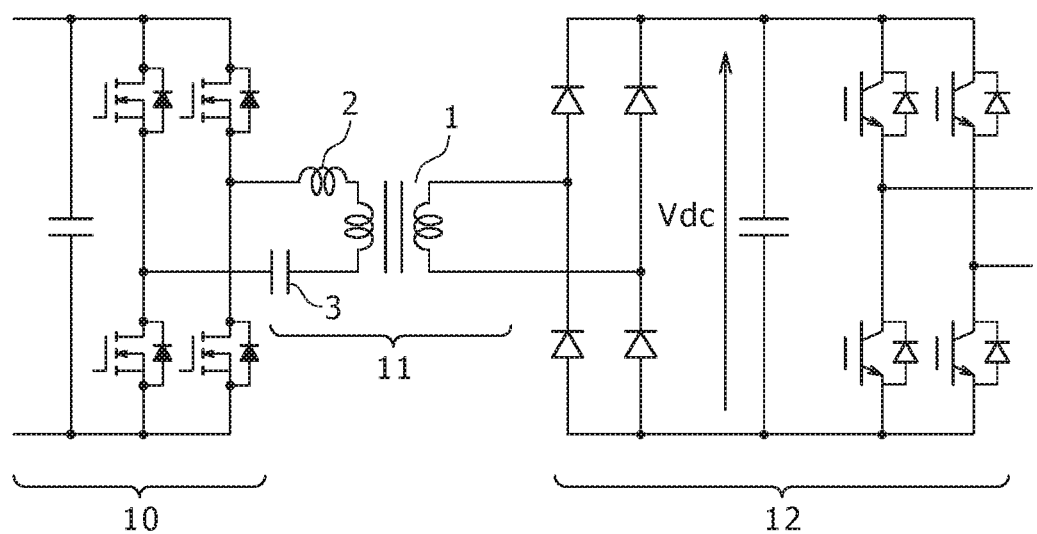
FIG. 3 is a circuit diagram illustrating a case where elements are changed in the configuration of the first embodiment according to the present invention.

An IGBT can be applied to the output inverter 12, as illustrated in FIG. 3, because a switching frequency of a serial multiple PWM is as low as several kHz or less as a whole, as compared with a driving frequency of the LLC resonant converter. An Si MOS FET or an SiC MOS FET can be applied as illustrated in FIG. 1, or another device can be applied as long it has the same function.

Figure 4:
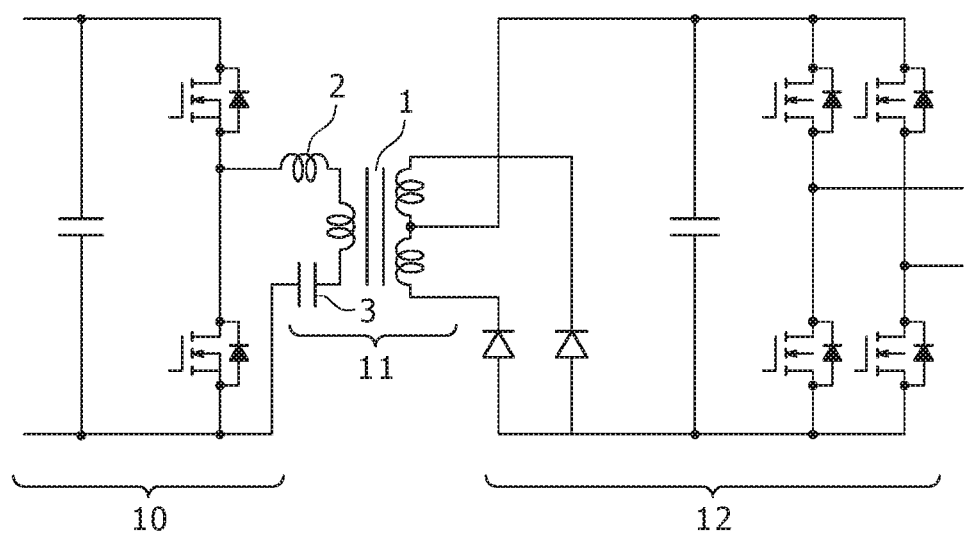
FIG. 4 is a circuit diagram illustrating a case where the number of the used elements is reduced in the configuration of the first embodiment of the present invention.

FIG. 4 illustrates a case where the number of driving elements in the LLC resonant converter 10 is halved. The width of the voltage input to the high-frequency transformer 1 on the primary side is ½ of that obtained by the H-bridge configuration illustrated in FIG. 1, but can be adjusted by adjusting a turn ratio of the high-frequency transformer to be the same.

The number of the inverters 12 connected in series in the serial multistage configuration is intended to be about eight to about six stages for each phase. In order to reduce the number of the stages, a Y-connection structure is intended to be used. However, this configuration can be achieved by a Δ-connection structure. In the case of the Y-connection structure, a phase voltage is $1/\sqrt{3}$ of a line voltage of 6.6 kV, and the DC voltage of the entire phase is $\sqrt{2}$ times as high as the line voltage as a reference. Therefore, when the number of stages is 8, Vdc is 600 V to 700 V, which is a voltage enabling a 1200 V MOS FET to be used for the inverter 12 as described before. Thus, a high-voltage output can be obtained by a low-voltage element. While the LLC resonant converter 10 has a potential of 1000 V or less with respect to a ground voltage, floating connection is applied to the inverter 12. Therefore, the transformer 11 is intended to have an insulation function corresponding to 6.6 kV of the system.

With the above-described serial multistage configuration, it is possible to flexibly handle an output voltage other than the output voltage of 6.6 kV only by changing the number of stages and the insulation of the transformer 11 depending on the circumstances.

Figure 2:
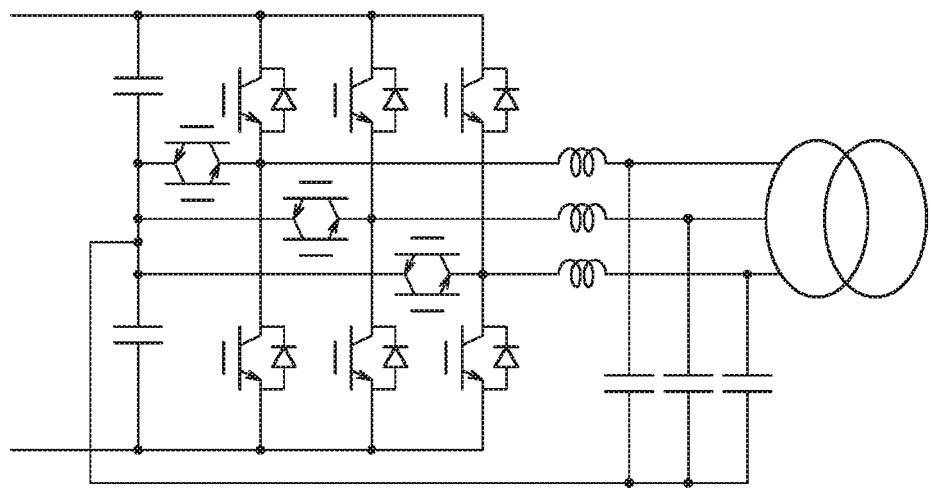
FIG. 2 is a circuit diagram illustrating a configuration of a conventional PCS.

Further, the above-described serial multistage configuration eliminates the need for boosting the voltage in the conventional circuit illustrated in FIG. 2, and the current path can be largely reduced. The current path of about 2000 A is conventionally required in outputting 1 MW, as described before, but can be reduced to about 152 A in the above-described serial multistage configuration. Thus, the size and weight reduction can be achieved.

Figure 6:
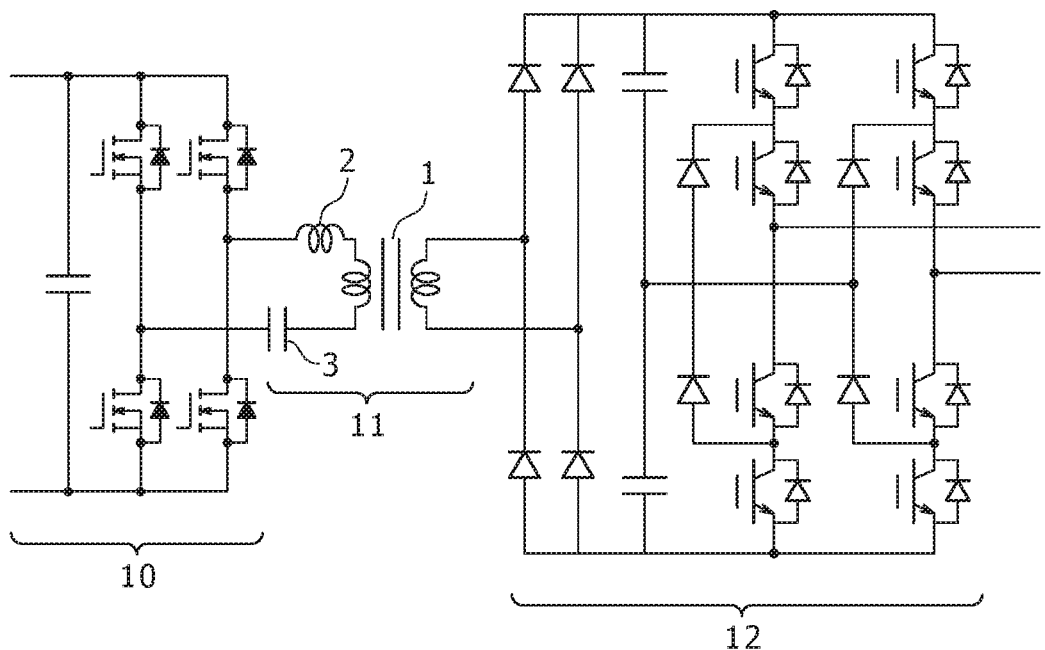
FIG. 6 illustrates a case where a different circuit is applied as the inverter in the configuration of the first embodiment according to the present invention.

FIG. 5 illustrates a configuration that can further reduce the multiple structures connected in series. The serial multistage configuration of FIG. 5 is intended that the number of the inverter 12 is four to three stages per phase. Although a single-phase inverter is used in the aforementioned configuration, a three-level inverter is used in this example. Therefore, the output of the inverter 12 in FIG. 5 corresponds to two stages in the configuration of FIG. 1. A usual three-level inverter can be applied to the inverter 12, as illustrated in FIG. 6. In order to reduce the stages, the Y-connection structure is intended to be used. However, this configuration can be achieved by the Δ-connection structure. In the case of the Y-connection structure, the phase voltage is $1/\sqrt{3}$ of the line voltage of 6.6 kV, and the DC voltage of the entire phase is $\sqrt{2}$ times as high as the line voltage as a reference. Therefore, when the number of stages is four, Vdc is 1200 V to 1400 V, which is a voltage enabling a 1200 V IGBT to be used for the inverter 12 in the case of 6 elements per arm and a 1700 V IGBT to be used in the case of four elements per arm, as described before. That is, a high-voltage output can be obtained by a low-voltage element. While the LLC resonant converter 10 has a potential of 1000 V or less with respect to the ground voltage, floating connection is applied to the inverter 12. Therefore, the transformer 11 is intended to have an insulation function corresponding to 6.6 kV of the system.

Next, a control method in this embodiment is described. An entire output control method is a serial multiplex PWM method. That is, PWM control is not performed in an entire voltage-full range, unlike a two-level inverter. Instead, the PWM control is performed only for a portion of each inverter stage. As a power-voltage element is used, switching loss tends to be smaller. Therefore, when this method is employed, the efficiency can be increased. Modulation control is performed in central control in accordance with Vdc in each inverter 12.

The LLC resonant converter 10 is subjected to LLC resonant control having a duty ratio of 50%. When a MOS NET is ON, a current flowing through the MOS FET flows in a reverse direction through a body diode of the MOS FET. Therefore, ZVS (Zero Volt Switching) occurs and no switching loss is generated when the MOS FET is ON. When the MOS FET is OFF, the current flowing through the MOS FET is peaked out and is suppressed to be sufficiently low. Therefore, the switching loss when the MOS NET is OFF is also small. Thus, highly efficient switching can be achieved by the LLC resonant control, so that the size reduction of a cooling unit for the power device can be achieved.

Figure 7:
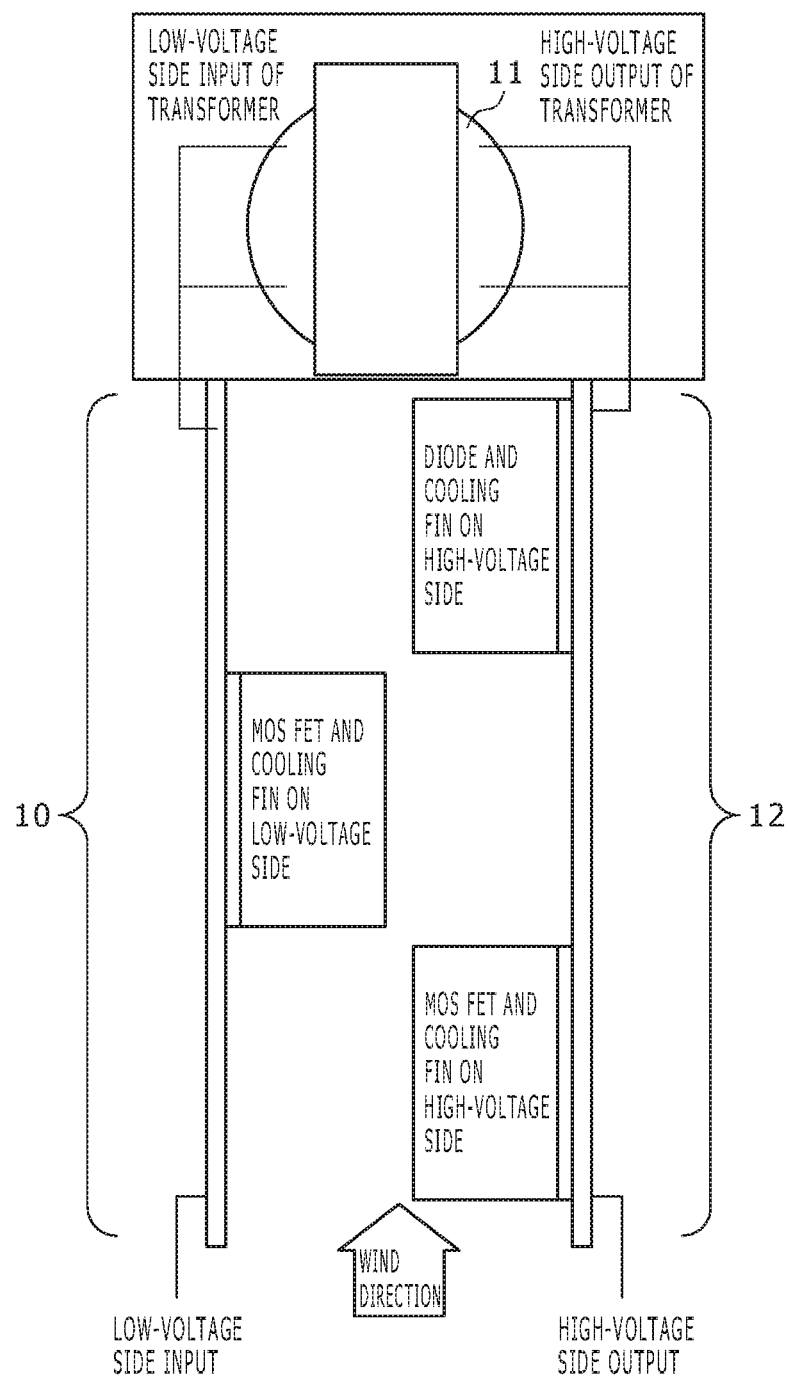
FIG. 7 illustrates a packaging structure according to the first embodiment of the present invention.

FIG. 7 illustrates a structure of the circuit in each stage.

A wind tunnel is formed by arranging the LLC resonant converter 10 and the inverter 12 to be opposed to each other, and a low voltage and a high voltage are connected via the transformer 11 arranged in a downstream in a wind path. The left side and the right side in FIG. 7 correspond to the low-voltage side and the high-voltage side, respectively, so that an insulation distance can be made the same and the small-sized structure can be achieved by optimization. Further, a path is formed so that a current flow through a low-voltage side input, a low-voltage side MOS FET, a low-voltage side transformer, a high-voltage side transformer, a high-voltage side diode, a high-voltage side MOS FET, and a high-voltage side output in that order only once. Thus, the connection path is optimized, thereby the size reduction can be achieved. Furthermore, a low-voltage side fin and a high-voltage side fin are arranged at positions where the fins do not interfere with each other. Thus, the width of the wind path between the converter 10 and the inverter 12 is reduced, so that a cooling efficiency is increased. Also, a clearance is maintained and therefore an insulation distance is ensured.

Figure 8:
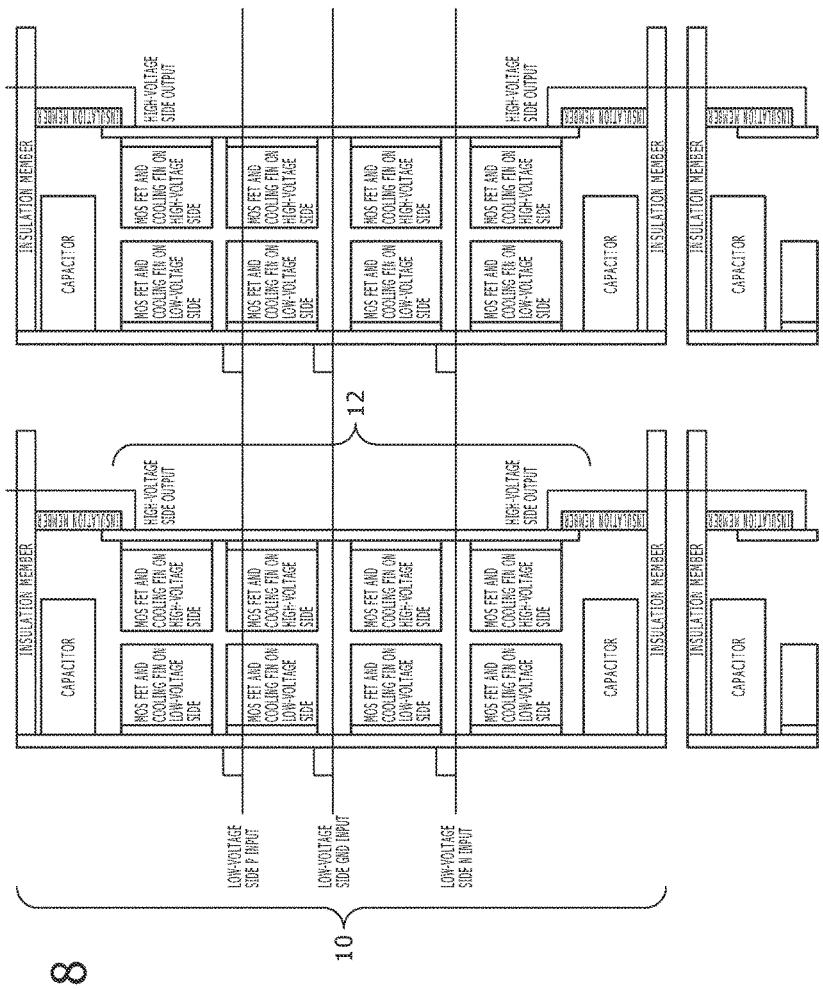
FIG. 8 is a front view illustrating a packaging form according to the first embodiment of the present invention.

FIG. 8 is a front view of a circuit configuration of each stage for describing a method of connecting the low-voltage side and the high-voltage side in each stage.

Three input terminals on the low-voltage side are arranged in a center portion in a vertical direction, and two output terminals on the high-voltage side are arranged near upper and lower ends in the vertical direction. This arrangement ensures the insulation distance and connectivity. Connection with other stages on the high-voltage side can be achieved at the upper and lower ends, and the connection with other stages on the lower-voltage side can be achieved at right and left ends. Therefore, a small arrangement can be achieved with the insulation distance ensured. Further, the inverter 12 is designed to be smaller than the LLC resonant converter 10. This design ensures ground insulation with a structure in which circuits of each stage are arranged by means of an insulation member.

Second Embodiment

Figure 9:
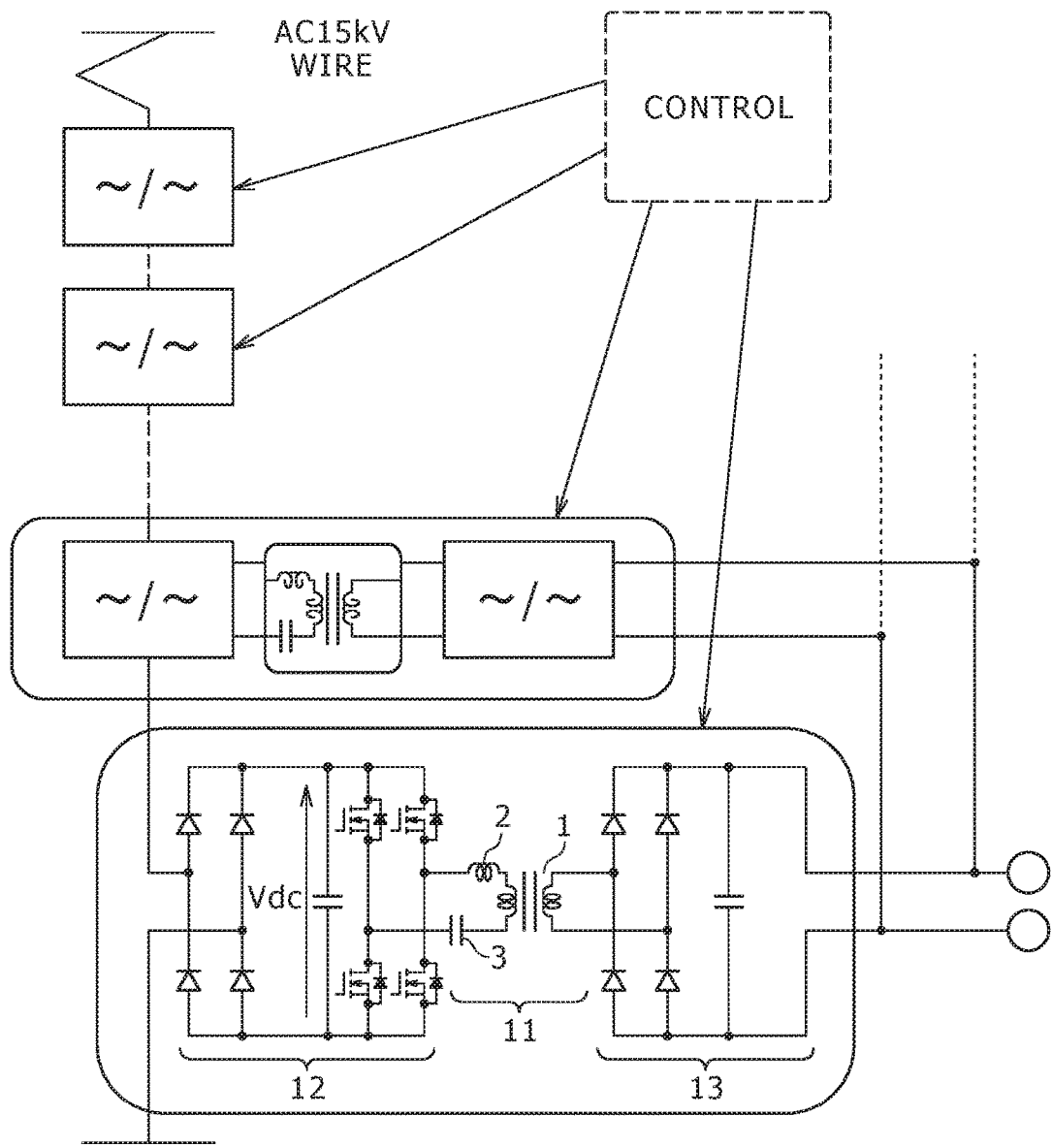
FIG. 9 is a circuit diagram illustrating a configuration of a second embodiment of the present invention.

FIG. 9 shows the configuration of the present embodiment.

The configuration of the present embodiment is intended to be a system for railways, which interconnects with a high voltage (a single-phase of 15 kV to 30 kV) and converts the high voltage to a low voltage.

The inverter 12 in the first embodiment is arranged on the input side, and the H-bridge diodes are connected in series to distribute a voltage. An AC output from the LLC resonant converter structure is output to the low-voltage side by a converter 13 as a DC output. With the serial multistage configuration including the inverters 12 connected in series, the illustrated configuration can handle a high-voltage Input, and a relatively low-voltage power semiconductor device, e.g., a 1700 V, 1200 V, and 650 V devices, can be used for the inverter 12. Further, Vdc is a voltage similar to that of the power semiconductor device and therefore a lower-voltage capacitor, as compared with a system voltage, can be used as a DC capacitor.

Because the H-bridge inverters 12 operate at a DC voltage of 1000 V or less, a MOS FET suitable for high-frequency driving is intended to be applied to the converter 12. A switching frequency is intended to be several tens to several hundreds of kHz. As the MOS FET to be used, an SiC MOS FET that has a high withstand voltage and is suitable for high-frequency switching can be used, or another device can be used as long as it has the same function. The converter 13 arranged on the secondary side of the LLC resonant converter is intended to perform smoothening by means of diodes. Other than Si diodes, Si Schottky barrier diodes or SiC Schottky barrier diodes can be used for reducing conduction loss, SiC MOS FETs can be used in synchronization with each other to reduce the loss, or other devices can be used as long as they have the same function.

For configuring the transformer 11 to be an LLC resonant type, the leakage inductance Lr 2 and the resonant capacitor Cr 3 are connected to the excitation inductance Lm of the high-frequency transformer 1 so that they resonate. The leakage inductance Lr 2 can be integrated within the high-frequency transformer as a structure that enables adjustment of a constant of a leakage magnetic flux in the high-frequency transformer. The resonant capacitor Cr 3 is intended to be formed by a film capacitor, but can be formed by another device as long as it has the same function. An insulation function will be described later.

The number of the driving elements for an LLC resonant converter portion in the inverter 12 can be halved as illustrated in FIG. 4. In this case, the width of the voltage input to the high-frequency transformer 1 on the primary side is ½ of that obtained in the H-bridge structure in FIG. 1, which is more suitable for voltage step-down.

The number of the inverters 12 connected in series in the serial multistage configuration is intended to be about 50 to about 15 stages, depending on the voltage. Vdc is about 600 V to about 700 V, which is a voltage enabling a 1200 V MOS FET to be used for the inverter 12, as described before. Thus, a high-voltage output can be obtained by a low-voltage element. While the converter 13 has a potential of 1000 V or less with respect to a ground voltage, floating connection is applied to the inverter 12. Therefore, the transformer 11 is intended to have an insulation function corresponding to 15 kV to 30 kV of the system.

With the aforementioned serial multistage configuration, it is possible to flexibly deal with an output voltage other than 15 kV only by changing the number of the stages and the insulation of the transformer 11 depending on circumstances.

Further, the aforementioned serial multistage configuration eliminates the need for voltage step-down performed in the conventional technique. Therefore, the current path can be distributed, so that the size and weight reduction can be achieved.

Next, a control method in the present embodiment is described.

The LLC resonant converter 10 is subjected to LLC resonant control with a duty ratio of 50%. When a MOS FET is ON, a current flowing through the MOS FET flows in a reverse direction through a body diode of the MOS FET. Therefore, ZVS (Zero Volt Switching) occurs and no switching loss is generated when the MOS FET is ON. When the MOS FET is OFF, the current flowing through the MOS FET is peaked out and is suppressed to be sufficiently low. Therefore, the switching loss when the MOS FET is OFF is also small, enabling highly efficient switching to be performed by the LLC resonant control. Consequently, a cooling unit for the power device can be made small.

As an entire output control method, LLC frequency control is performed in accordance with Vdc in each inverter 12 in central control.

The circuit configuration in each stage is intended to be the same as that in FIG. 7 in the first embodiment, but is not limited thereto.

Third Embodiment

Figure 10:
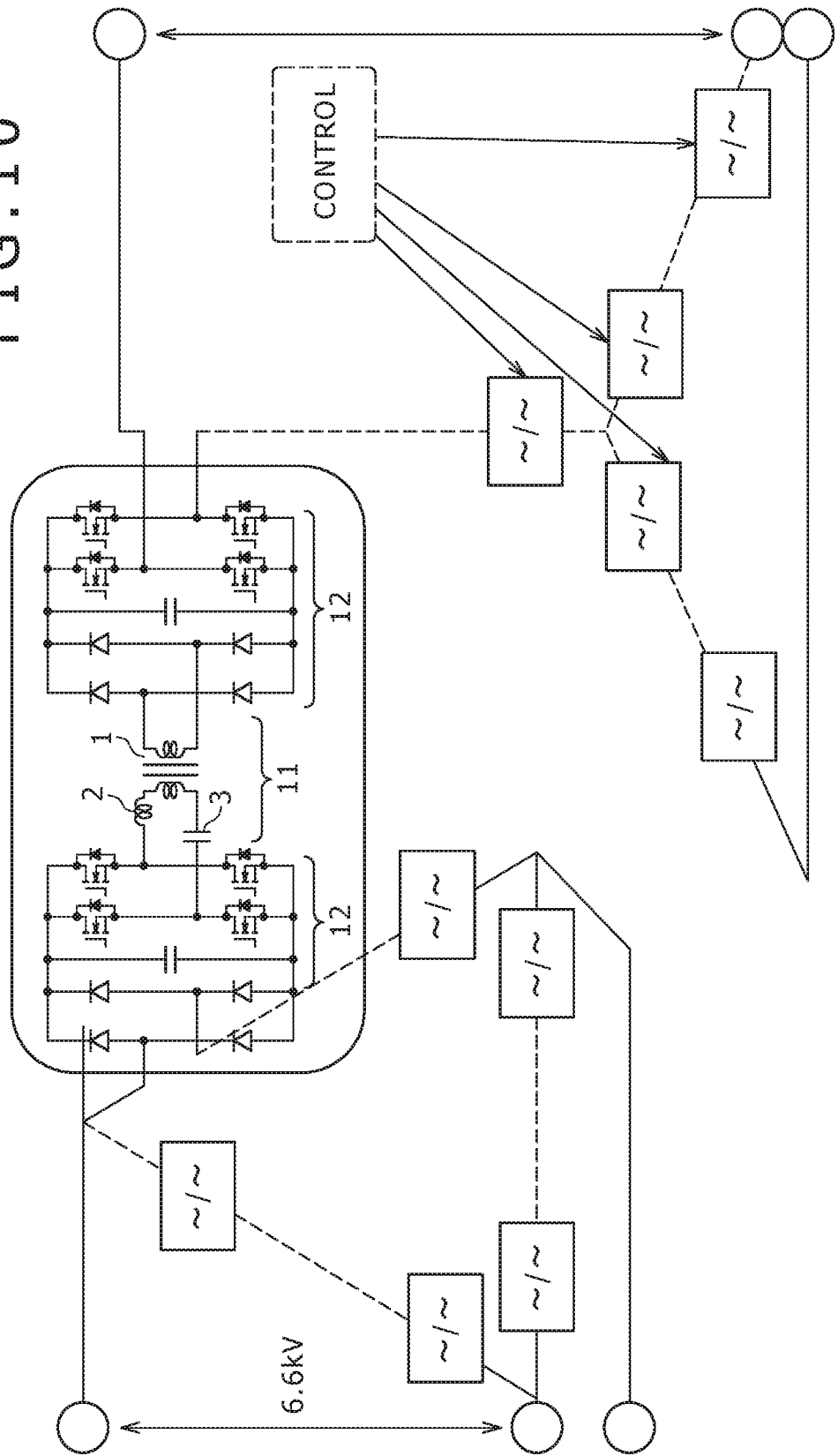
FIG. 10 is a circuit diagram illustrating a configuration of a third embodiment of the present invention.

FIG. 10 illustrates the configuration of the present embodiment.

The configuration of the present embodiment is intended to be a system that interconnects with a high voltage system (a three-phase 11 kV, 6.6 kV, or 3.3 kV system) and drives a high-voltage motor or pump with its output.

The inverter 12 in the first embodiment is arranged on the input side, and the H-bridge diodes are connected in series to distribute a voltage. An AC output from an LLC resonant converter structure is rectified by the H-bridge diodes of the inverter 12 having the same configuration. The rectified DC output is output by means of the multiplexed inverters. With the serial multistage configuration in which the inverters 12 are connected in series, the illustrated configuration can handle a high-voltage input and a high-voltage output, and a relatively low-voltage power semiconductor device, e.g., a 1700 V, 1200 V, or 650 V power semiconductor device, can be used for the inverter 12. Further, Vdc is also a voltage similar to that of the power semiconductor device. Therefore, a lower-voltage capacitor, as compared with a system voltage, can be used for a DC capacitor.

Because the H-bridge inverters 12 operate at a DC voltage of 1000 V or less, a MOS FBI suitable for high-frequency driving is intended to be used. A switching frequency is intended to be several tens to several hundreds of kHz. As the MOS BET to be used, an SiC MOS FET that has a high withstand voltage and is suitable for high-frequency switching can be used, or another device can be used as long as it has the same function. The inverter 12 arranged on the secondary side of the LLC resonant converter is intended to perform smoothening by means of diodes. Other than Si diodes, Si Schottky barrier diodes or SiC Schottky barrier diodes can be used for reducing conduction loss, SiC MOS FETs can be used in synchronization with each other to reduce the loss, or other devices can be used as long as they have the same function.

For configuring the transformer 11 to be an LLC resonant type, the leakage inductance Lr 2 and the resonant capacitor Cr 3 are connected to the excitation inductance Lm of the high-frequency transformer 1 so that they resonate. The leakage inductance Lr 2 can be integrated within the high-frequency transformer as a structure that enables adjustment of a constant of a leakage magnetic flux in the high-frequency transformer. The resonant capacitor Cr 3 is intended to be formed by a film capacitor, but can be formed by another device as long as it has the same function. An insulation function will be described later.

In the serial multistage configuration, the number of the inverters 12 to be connected in series is intended to be about 14 to about three stages, depending on a voltage and a withstand voltage of an element. A structure having Y connection at its output is intended to be used for reducing the number of the inverter 12's stages. However, a structure using Δ connection can be used. In the case of the Y connection, a phase voltage is $1/\sqrt{3}$ of a line voltage of 6.6 kV, and a DC voltage of the entire phase is $\sqrt{2}$ times as high as the line voltage as a reference. Therefore, when the number of stages is eight, Vdc is from 600 V to 700 V, which is a voltage enabling a 1200 V MOS FET to be used for the inverter 12, as described before. Thus, a high-voltage output can be obtained by a low-voltage element. The LLC resonant converter 10 has a potential of 1000 V or less with respect to a ground voltage, and floating connection is applied to the inverter 12. Therefore, the transformer 11 is intended to have an insulation function corresponding to 6.6 kV of the system.

With the aforementioned serial multistage configuration, it is possible to flexibly deal with an output voltage other than the output voltage of 6.6 kV only by chancing the number of the stages and the insulation of the transformer 11.

Further, the aforementioned serial multistage configuration eliminates three-phase wiring between conventional multiple transformers and the stages. Therefore, the size and weight reduction can be achieved.

Next, a control method in the present embodiment is described.

The LLC resonant converter 10 is subjected to LLC resonant control with a duty ratio of 50%. When a MOS FET is ON, a current flowing through the MOS FET flows in a reverse direction through a body diode of the MOS FET Therefore, ZVS (Zero Volt Switching) occurs and no switching loss is generated when the MOS FET is ON. When the MOS FET is OFF, the current flowing through the MOS FET is peaked out and is suppressed to be sufficiently low. Therefore, the switching loss when the MOS FET is OFF is also small, enabling highly efficient switching by the LLC resonant control. Consequently, a cooling unit for the power device can be made small.

As an entire input control method, LLC frequency control is performed in accordance with Vdc in each inverter 12 in central control. Further, an entire output control method is a serial multiplex PWM method in which PWM control is not performed for an entire voltage-full range, unlike a two-level inverter, but is performed for only a portion of each inverter stage. Because a lower-voltage element tends to have smaller switching loss, the use of this method can improve the efficiency. Modulation control is performed in the central control in accordance with Vdc of each inverter 12.

Three embodiments have been described above. However, the contents of the aforementioned embodiments can be combined and used as appropriate, depending on the use.

What is claimed is:

1. A power supply apparatus comprising a power supply module including:
    a wind tunnel structure including two power supply substrates with different voltage levels and insulation members forming two faces of the wind tunnel structure other than faces formed by the power supply substrates, each of the power supply substrates having a cooling unit mounted on only one of surfaces thereof, the power supply substrates being opposed with the cooling units adjacent to each other; and
    another wind tunnel arranged in a downstream of the wind tunnel structure,
    wherein the two power supply substrates are electrically connected to each other via a transformer and a capacitor arranged in the other wind tunnel.

2. The power supply apparatus of claim 1, wherein the power supply module further includes a reactor in addition to the transformer and the capacitor, and the two power supply substrates are electrically connected to each other via the transformer, the capacitor, and the reactor.

3. The power supply apparatus of claim 1,
    wherein one of the power supply substrates is provided with high-voltage terminals near its upper and lower ends, and another one of the power supply substrates is provided with low-voltage terminals around its center, and
    the power supply apparatus is connected with another power supply apparatus on a high-voltage terminal side in a vertical direction and is connected with another power supply apparatus on a low-voltage terminal side on a right or left side.

4. The power supply apparatus of claim 1, wherein an LLC resonant converter is provided for its input and a single-phase inverter is provided for its output, the inputs are connected in parallel, and the outputs are connected in series.

5. The power supply apparatus of claim 4, wherein the serial connection of the outputs is achieved by Y-connection.

6. The power supply apparatus of claim 4, wherein the serial connection of the outputs is achieved by Δ-connection.

7. The power supply apparatus of claim 1, wherein a converter formed by a single-phase diode bridge is provided for its input, an LLC resonant converter is provided for its output, the inputs are connected in series, and the outputs are connected in parallel.

8. The power supply apparatus of claim 1,
    wherein a converter formed by a single-phase diode bridge is provided for its input, a single-phase inverter is provided for its output, and an LLC resonant converter is provided between each of the input and the output, and
    the inputs are connected in series and the outputs are connected in series.

9. The power supply apparatus of claim 8, wherein the serial connection of the inputs is achieved by Δ connection and the serial connection of the outputs is achieved by Y connection.

10. The power supply apparatus of claim 8, wherein the serial connection of the inputs is achieved by Y connection and the serial connection of the outputs is achieved by Δ connection.

11. The power supply apparatus of claim 8, wherein the serial connection of the inputs is achieved by Y connection and the serial connection of the outputs is achieved by Y connection.

12. The power supply apparatus of claim 8, wherein the serial connection of the inputs is achieved by Δ connection and the serial connection of the outputs is achieved by Δ connection.

* * * * *